United States Patent
Wu et al.

(10) Patent No.: US 9,502,514 B2
(45) Date of Patent: Nov. 22, 2016

(54) MEMORY DEVICES AND METHOD OF FORMING SAME

(71) Applicant: Taiwan Semiconductor Manufacturing Company, Ltd., Hsin-Chu (TW)

(72) Inventors: Chang-Ming Wu, New Taipei (TW); Wei Cheng Wu, Zhubei (TW); Shih-Chang Liu, Alian Township (TW); Chia-Shiung Tsai, Hsin-Chu (TW); Harry-Hak-Lay Chuang, Crescent (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/794,682

(22) Filed: Jul. 8, 2015

(65) Prior Publication Data
US 2015/0311296 A1    Oct. 29, 2015

Related U.S. Application Data

(62) Division of application No. 14/040,055, filed on Sep. 27, 2013, now Pat. No. 9,082,651.

(51) Int. Cl.
*H01L 29/792*     (2006.01)
*H01L 29/423*     (2006.01)
(Continued)

(52) U.S. Cl.
CPC ...... *H01L 29/4234* (2013.01); *H01L 27/11517* (2013.01); *H01L 27/11521* (2013.01); *H01L 27/11568* (2013.01); *H01L 29/42324* (2013.01); *H01L 29/42328* (2013.01); *H01L 29/66825* (2013.01); *H01L 29/788* (2013.01); *H01L 29/7881* (2013.01); *H01L 29/792* (2013.01); *H01L 21/28282* (2013.01); *H01L 21/823456* (2013.01)

(58) Field of Classification Search
CPC ............... H01L 21/823456; H01L 29/42344
USPC ....................................................... 257/324
See application file for complete search history.

(56) References Cited

U.S. PATENT DOCUMENTS 6,803,620 B2    10/2004  Moriya et al.
7,235,441 B2     6/2007  Yasui et al.
(Continued)

FOREIGN PATENT DOCUMENTS

JP     2009010035 A    1/2009
JP     2009194221 A    8/2009
(Continued)

OTHER PUBLICATIONS

Shinichiro, JP2009010035 (English translation).*
(Continued)

*Primary Examiner* — Chandra Chaudhari
(74) *Attorney, Agent, or Firm* — Slater Matsil, LLP

(57) ABSTRACT

A device comprises a control gate structure over a substrate, a memory gate structure over the substrate, wherein a charge storage layer formed between the control gate structure and the memory gate structure, a first spacer along a sidewall of the memory gate structure, a second spacer over a top surface of the memory gate structure, a first drain/source region formed in the substrate and adjacent to the memory gate structure and a second drain/source region formed in the substrate and adjacent to the control gate structure.

19 Claims, 20 Drawing Sheets

(51) Int. Cl.
*H01L 29/66* (2006.01)
*H01L 29/788* (2006.01)
*H01L 27/115* (2006.01)
H01L 21/28 (2006.01)
H01L 21/8234 (2006.01)

(56) References Cited

U.S. PATENT DOCUMENTS

| | | | |
|---|---|---|---|
| 7,423,314 B2 | 9/2008 | Mizukoshi | |
| 7,663,179 B2 | 2/2010 | Shinohara et al. | |
| 8,154,070 B2 | 4/2012 | Mizukoshi | |
| 2007/0228498 A1 | 10/2007 | Toba et al. | |
| 2010/0301404 A1* | 12/2010 | Kawashima | H01L 21/28273 257/316 |
| 2012/0068243 A1 | 3/2012 | Kawashima et al. | |
| 2013/0026552 A1 | 1/2013 | Toh et al. | |
| 2013/0126960 A1 | 5/2013 | Chakihara et al. | |
| 2013/0240977 A1 | 9/2013 | Kaneoka et al. | |
| 2015/0155293 A1 | 6/2015 | Wu et al. | |

FOREIGN PATENT DOCUMENTS

| | | |
|---|---|---|
| JP | 2011103401 A | 5/2011 |
| JP | 2011176348 A | 9/2011 |
| JP | 2013021262 A | 1/2013 |
| KR | 20130105443 A | 9/2013 |

OTHER PUBLICATIONS

Takuro, JP2009194221 (English translation).*
Tiwari, S., et al., "A silicon nanocrystals based memory," Applied Physics Letters 68, Mar. 4, 1996, pp. 1377-1379.

* cited by examiner

MEMORY DEVICES AND METHOD OF FORMING SAME

This application is a divisional of U.S. patent application Ser. No. 14/040,055, entitled "Memory Devices and Method of Forming Same," filed on Sep. 27, 2013, which application is incorporated herein by reference.

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

One type of EEPROM memory device is referred to as a flash memory device. Flash memories have become increasingly popular in recent years. A typical flash memory comprises a memory array having a large number of memory cells arranged in rows and columns. Each of the memory cells is fabricated as a field-effect transistor having a drain region, a source region, a control gate and a floating gate.

The floating gate is disposed above a substrate. The floating gate is between the source region and the drain region, but separated from them by an oxide layer. The floating gate may be formed of suitable materials such as polycrystalline silicon ("poly") and/or some other conductive materials. The oxide layer may be formed of silicon dioxide ($SiO_2$) and/or the like. The control gate may be disposed over the floating gate. The control gate and the floating gate may be separated by a thin oxide layer.

In operation, a floating gate is capable of holding a charge and is separated from source and drain regions contained in a substrate by an oxide layer. Each of the memory cells may be electrically charged by injecting electrons from the substrate through the oxide layer. The charge may be removed from the floating gate by tunneling the electrons to the source region or an erase gate during an erase operation. The data in flash memory cells are thus determined by the presence or absence of electrical charges in the floating gates.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a flash memory device. The embodiments of the disclosure may also be applied, however, to a variety of memory devices. Hereinafter, various embodiments will be explained in detail with reference to the accompanying drawings.

Figure 1:
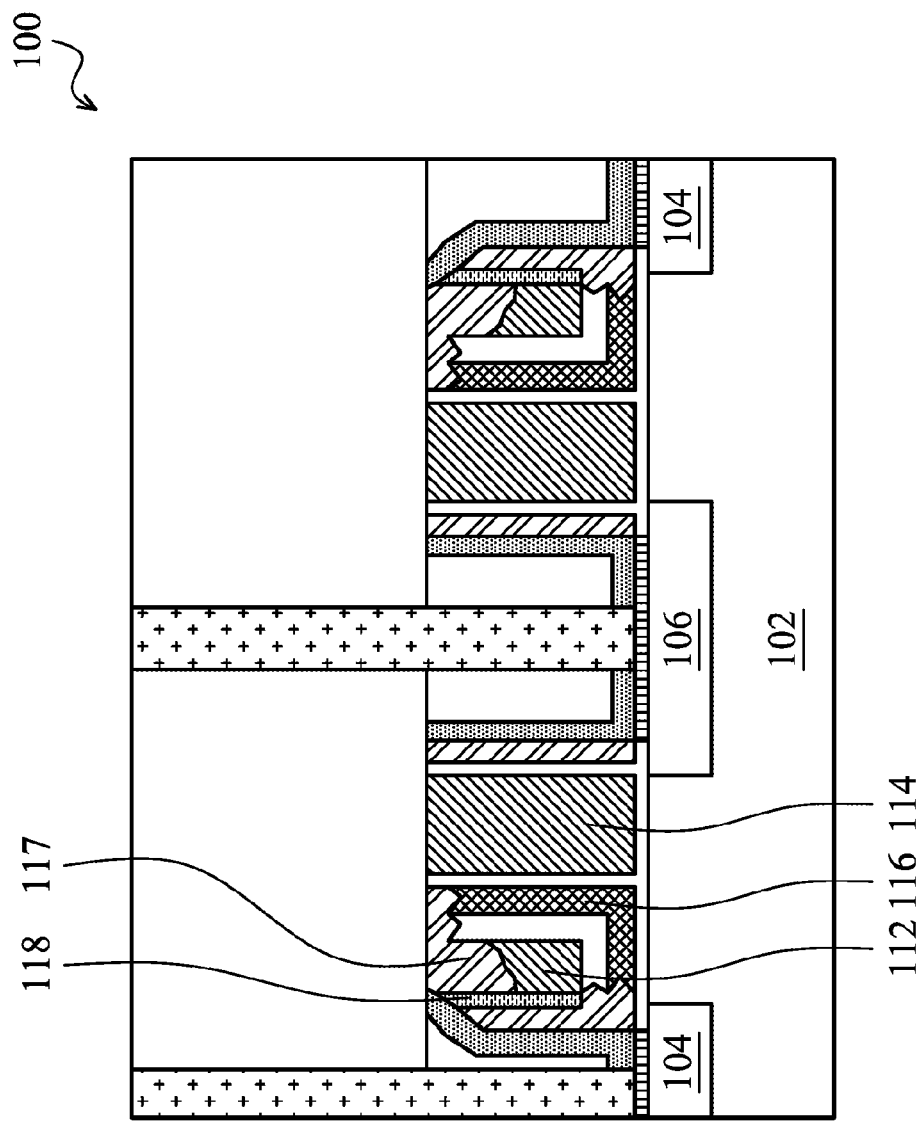
FIG. 1 illustrates a cross sectional view of a memory structure in accordance with various embodiments of the present disclosure.

FIG. 1 illustrates a cross sectional view of a memory structure in accordance with various embodiments of the present disclosure. In some embodiments, the memory structure 100 may be a flash memory cell having a first drain/source region 104 and a second drain/source region 106.

The memory structure 100 comprises a gate structure comprising a control gate 114 and a memory gate 112. Both the control gate 114 and the memory gate 112 are formed over a substrate 102. The memory structure 100 further comprises a charge storage layer 116. As shown in FIG. 1, the charge storage layer 116 is an L-shaped layer. A horizontal side of the L-shaped layer is formed between the substrate 102 and the memory gate 112. A vertical side of the L-shaped layer is formed between the memory gate 112 and the control gate 114. It should be noted that the charge storage layer 116 is enclosed by dielectric materials. As a result, the charge storage layer 116 is isolated from the memory gate 112, the control gate 114 and the substrate 102 respectively.

As shown in FIG. 1, the top surface of the memory gate 112 is protected by a dielectric layer such as a silicon nitride layer 117 and/or the like. Such a dielectric layer helps to prevent a salicide layer from being formed on top of the memory gate 112. FIG. 1 also illustrates there may be a spacer layer 118 formed over the sidewall of the memory gate 112. Such a spacer layer 118 helps to protect the sidewall of the memory gate 112 and form the drain/source regions in a self-aligned manner.

The memory structure 100 may comprise a variety of semiconductor regions. For the purpose of clearly illustrating the inventive aspects of the various embodiments, only a few regions are described in detail herein. The rest of the semiconductor regions of the memory structure 100 will be described below with respect to FIGS. 2-16.

Figure 2:
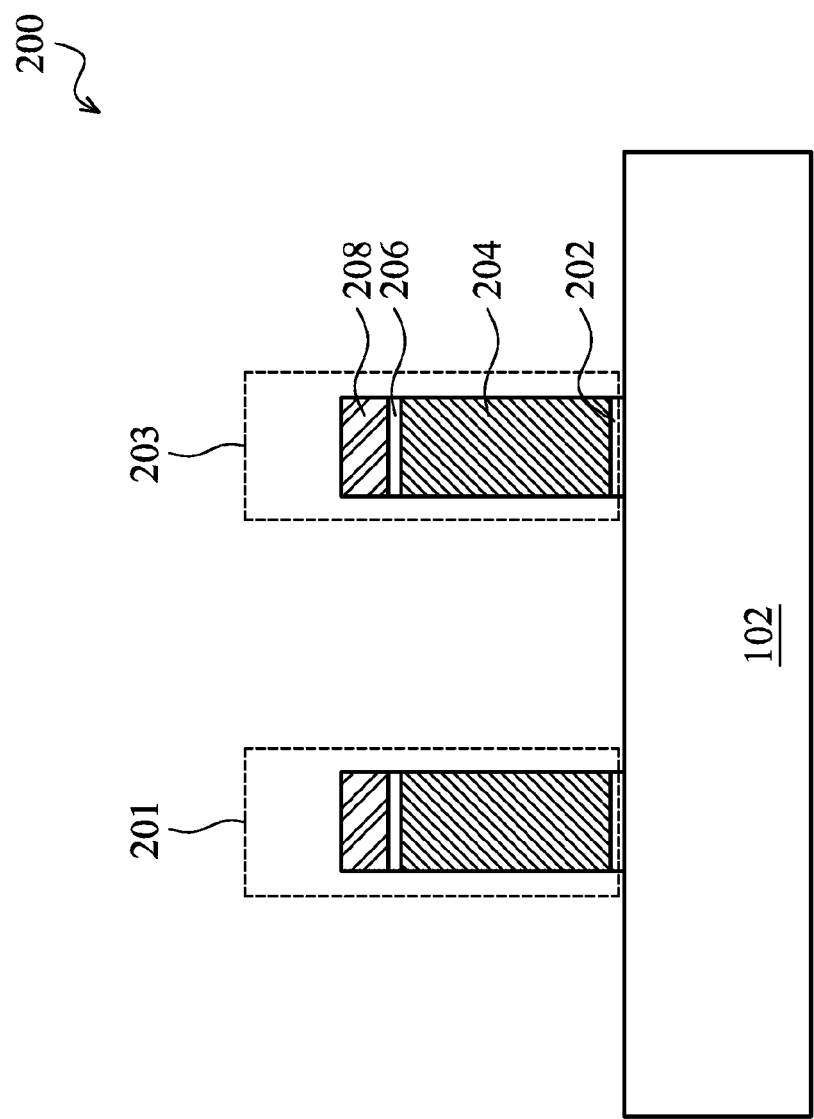
FIG. 2 illustrates a cross sectional view of a semiconductor device having a control gate formed over a substrate in accordance with various embodiments of the present disclosure.

FIGS. 2-16 illustrate intermediate steps of fabricating the memory structure shown in FIG. 1 in accordance with various embodiments of the present disclosure. FIG. 2 illustrates a cross sectional view of a semiconductor device having a control gate formed over a substrate in accordance with various embodiments of the present disclosure. As shown in FIG. 2, a plurality of gate structures 201 and 203 may be formed over the substrate 102. It should be noted while FIG. 2 illustrates two gate structures, the semiconductor device 200 may accommodate any number of gate structures.

The substrate 102 may be formed of silicon, although it may also be formed of other group III, group IV, and/or group V elements, such as silicon, germanium, gallium, arsenic, and combinations thereof. The substrate 102 may also be in the form of bulk substrate or silicon-on-insulator (SOI) substrate.

In forming the gate structures 201 and 203 shown in FIG. 2, a gate dielectric layer 202 is deposited over the substrate 102 and a gate electrode layer such as a poly layer 204 is formed over the gate dielectric layer 202. A hard mask structure including an oxide layer 206 and a nitride layer 208 is formed over the poly layer 204. To form the gate structures 201 and 203 shown in FIG. 2, a photoresist layer (not shown) may be formed over the hard mask structure and a patterning process is applied to the photoresist layer. After an etching process, the gate structures 201 and 203 are formed as shown in FIG. 2.

The gate dielectrics layer 202 may be a dielectric material, such as silicon oxide, silicon oxynitride, silicon nitride, an oxide, a nitrogen-containing oxide, a combination thereof, or the like. The gate dielectrics layer 202 may have a relative permittivity value greater than about 4. Other examples of such materials include aluminum oxide, lanthanum oxide, hafnium oxide, zirconium oxide, hafnium oxynitride, or combinations thereof.

In some embodiments, the gate electrode layer 204 may be formed of poly-silicon. The gate electrode layer 204 may be formed by depositing doped or undoped poly-silicon by low-pressure chemical vapor deposition (LPCVD) to a thickness in the range of about 400 Å to about 2,400 Å, such as about 1,400 Å.

In alternative embodiments, the gate electrode layer 204 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like.

Figure 3:
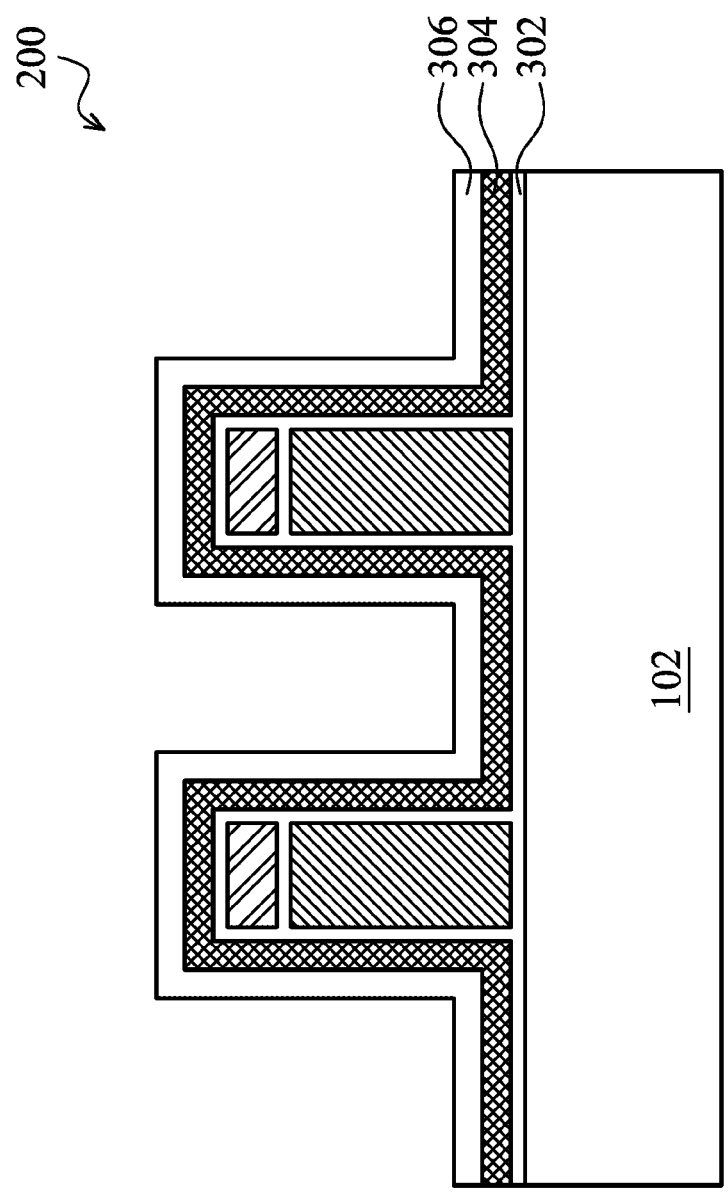
FIG. 3 illustrates a cross sectional view of a semiconductor device shown in FIG. 2 after an O—Si—O structure is formed over the gate structure shown in FIG. 2 in accordance with various embodiments of the present disclosure.

FIG. 3 illustrates a cross sectional view of a semiconductor device shown in FIG. 2 after an oxide-silicon-oxide (O—Si—O) structure is formed over the gate structure shown in FIG. 2 in accordance with various embodiments of the present disclosure. The O—Si—O structure includes a first oxide layer 302, a silicon dot layer 304 and a second oxide layer 306. As shown in FIG. 3, the first oxide layer 302 is deposited over the top surface of the substrate 102, the sidewalls of the gate structures and the top surfaces of the gate structures. In some embodiments, the first oxide layer 302 is of a thickness of about 50 Å.

The silicon dot layer 304 is formed over the first oxide layer 302. In some embodiments, the silicon dot layer 304 is of a thickness of about 100 Å. The silicon dot layer 304 may be formed by using suitable deposition techniques such as LPCVD, plasma enhanced chemical vapor deposition (PECVD) and/or the like. The semiconductor device 200 may be placed into a low pressure furnace (not shown). The reactive gases of the deposition process may include SiH4 and/or the like. The reactive gases may be mixed with a carrier gas such as N2, Ar and/or the like.

In some embodiments, the silicon dot formation process is of a temperature in a range from about 400 degrees to about 800 degrees. The flow rate of the reactive gases is in a range from about 5 Standard Liter per Minute (SLM) to about 20 SLM. The pressure of the silicon dot formation process is in a range from about 5 Torr to about 20 Torr.

As shown in FIG. 3, the second oxide layer 306 is deposited over the top surface of the silicon dot layer 304 through suitable semiconductor deposition techniques. In some embodiments, the second oxide layer 306 is of a thickness of about 100 Å.

Figure 4:
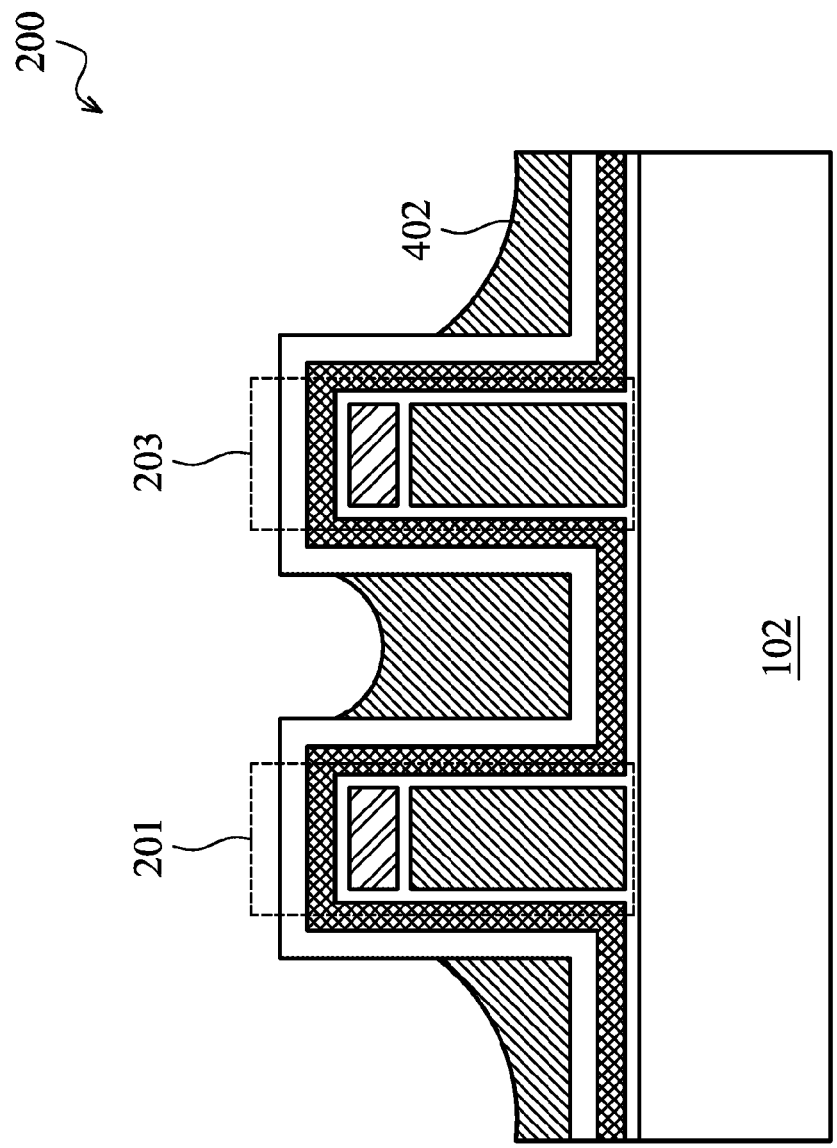
FIG. 4 illustrates a cross sectional view of the semiconductor device shown in FIG. 3 after a memory gate electrode layer is deposited over the substrate in accordance with various embodiments of the present disclosure.

FIG. 4 illustrates a cross sectional view of the semiconductor device shown in FIG. 3 after a memory gate electrode layer is deposited over the substrate in accordance with various embodiments of the present disclosure. The memory gate electrode layer 402 may be formed of suitable materials such as poly-silicon. The memory gate electrode layer 402 is deposited over the semiconductor device 200 using suitable deposition techniques such as chemical vapor deposition (CVD) and/or the like. After the memory gate electrode layer 402 is deposited over the semiconductor device 200, the control gate structures 201 and 203 may be embedded in the memory gate electrode layer 402. An etch-back process may be used to remove the upper portion of the memory gate electrode layer 402 to form the remaining memory gate electrode layer shown in FIG. 4.

Figure 5:
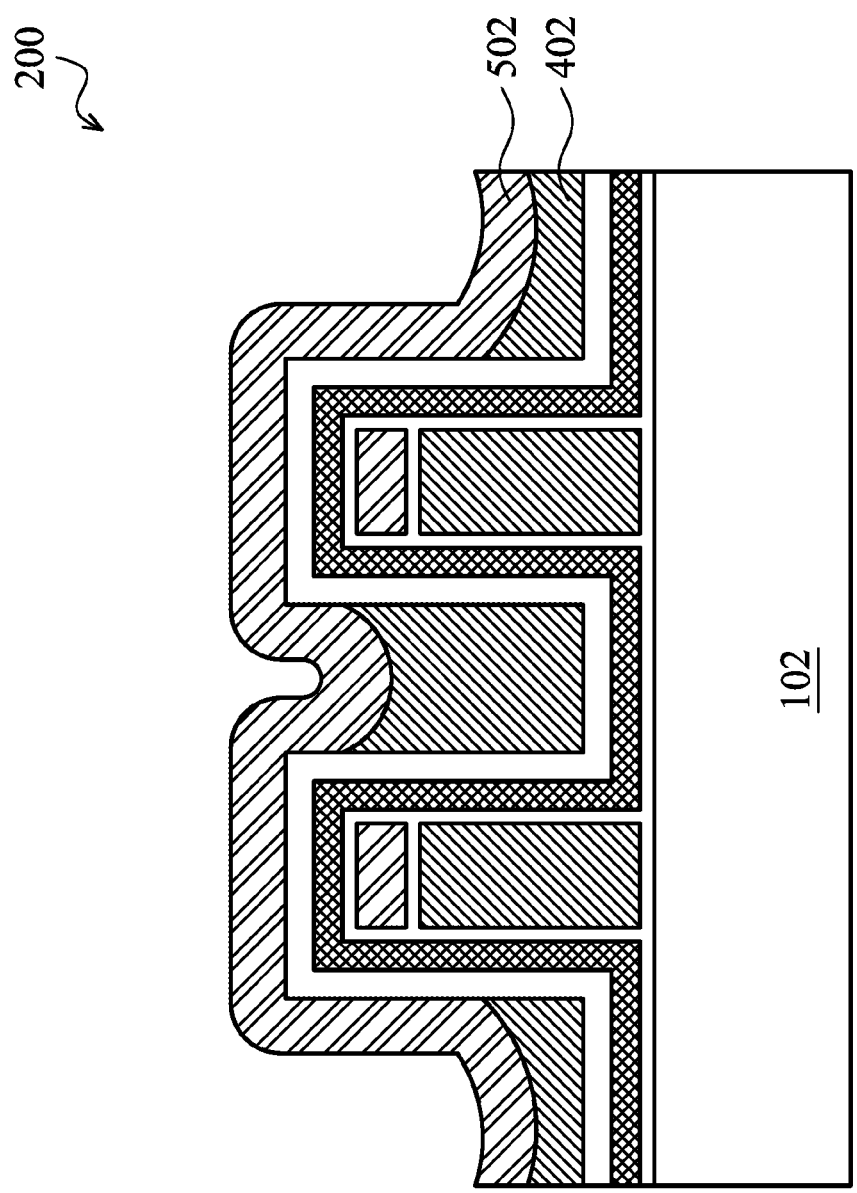
FIG. 5 illustrates a cross sectional view of the semiconductor device shown in FIG. 4 after a memory gate mask layer is deposited over the semiconductor device in accordance with various embodiments of the present disclosure.

FIG. 5 illustrates a cross sectional view of the semiconductor device shown in FIG. 4 after a memory gate mask layer is deposited over the semiconductor device in accordance with various embodiments of the present disclosure. In some embodiments, the memory gate mask layer 502 is formed of suitable materials such as silicon nitride and/or the like. The memory gate mask layer 502 may be deposited over the memory gate electrode layer 402 through suitable semiconductor deposition techniques.

Figure 6:
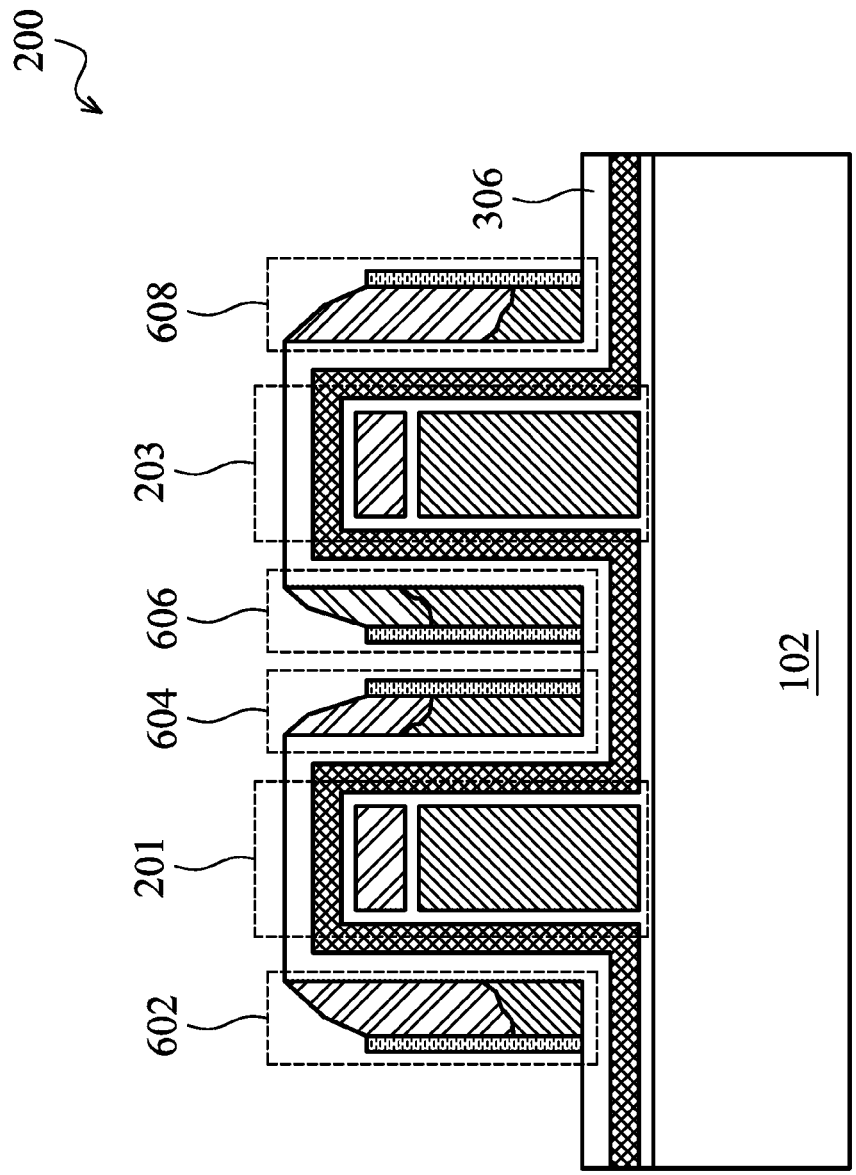
FIG. 6 illustrates a cross sectional view of the semiconductor device shown in FIG. 5 after an etching process is applied to the semiconductor device in accordance with various embodiments of the present disclosure.

FIG. 6 illustrates a cross sectional view of the semiconductor device shown in FIG. 5 after an etching process is applied to the semiconductor device in accordance with various embodiments of the present disclosure. An etching process is applied to the semiconductor device 200. By controlling the strength and direction of the etching process, portions of the memory gate electrode layer 402 and the memory gate mask layer 502 have been removed. The etching process stops on the top surface of the second oxide layer 306.

As shown in FIG. 6, after the etching process finishes, there may be four resulting memory gate structures, namely a first memory gate structure 602, a second memory gate structure 604, a third memory gate structure 606 and a fourth memory gate structure 608. As shown in FIG. 6, the first memory gate structure 602 and the second memory gate structure 604 are formed along opposite sidewalls of the first control gate structure 201. Likewise, the third memory gate structure 606 and the fourth memory gate structure 608 are formed along opposite sidewalls of the second control gate structure 203.

Figure 7:
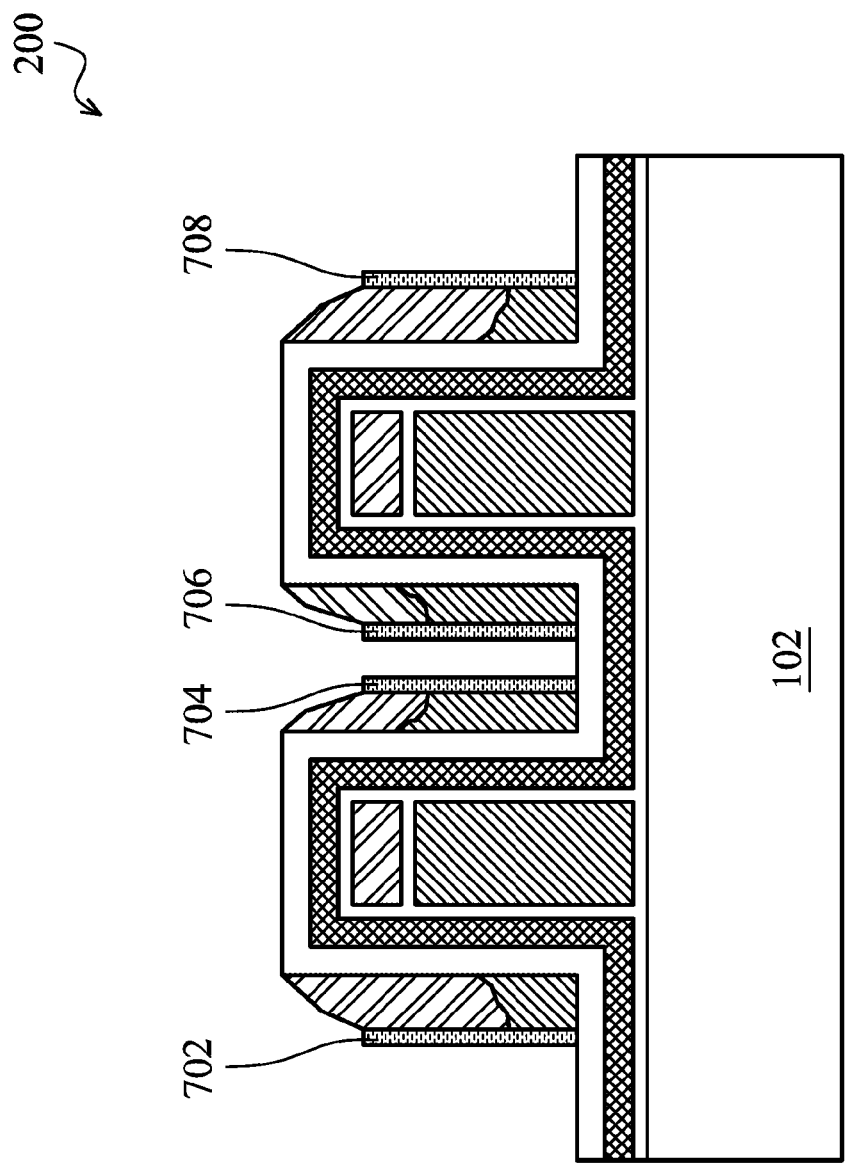
FIG. 7 illustrates a cross sectional view of the semiconductor device shown in FIG. 6 after a plurality of spacers are formed over their respective memory gate structures in accordance with various embodiments of the present disclosure.

FIG. 7 illustrates a cross sectional view of the semiconductor device shown in FIG. 6 after a plurality of spacers are formed over their respective memory gate structures in accordance with various embodiments of the present disclosure. A spacer layer (not shown) may be formed by blanket depositing one or more spacer layers (not shown) over the semiconductor device 200. The spacer layer may comprise SiN, oxynitride, SiC, SiON, oxide, and the like and may be formed by commonly used methods such as CVD, PECVD, sputter, and other methods known in the art. The spacer layer may be patterned, such as by isotropically or anisotropically etching, thereby removing the spacer layer from the horizontal surfaces of the structure and forming the spacers 702, 704, 706 and 708 as illustrated in FIG. 7.

Figure 8:
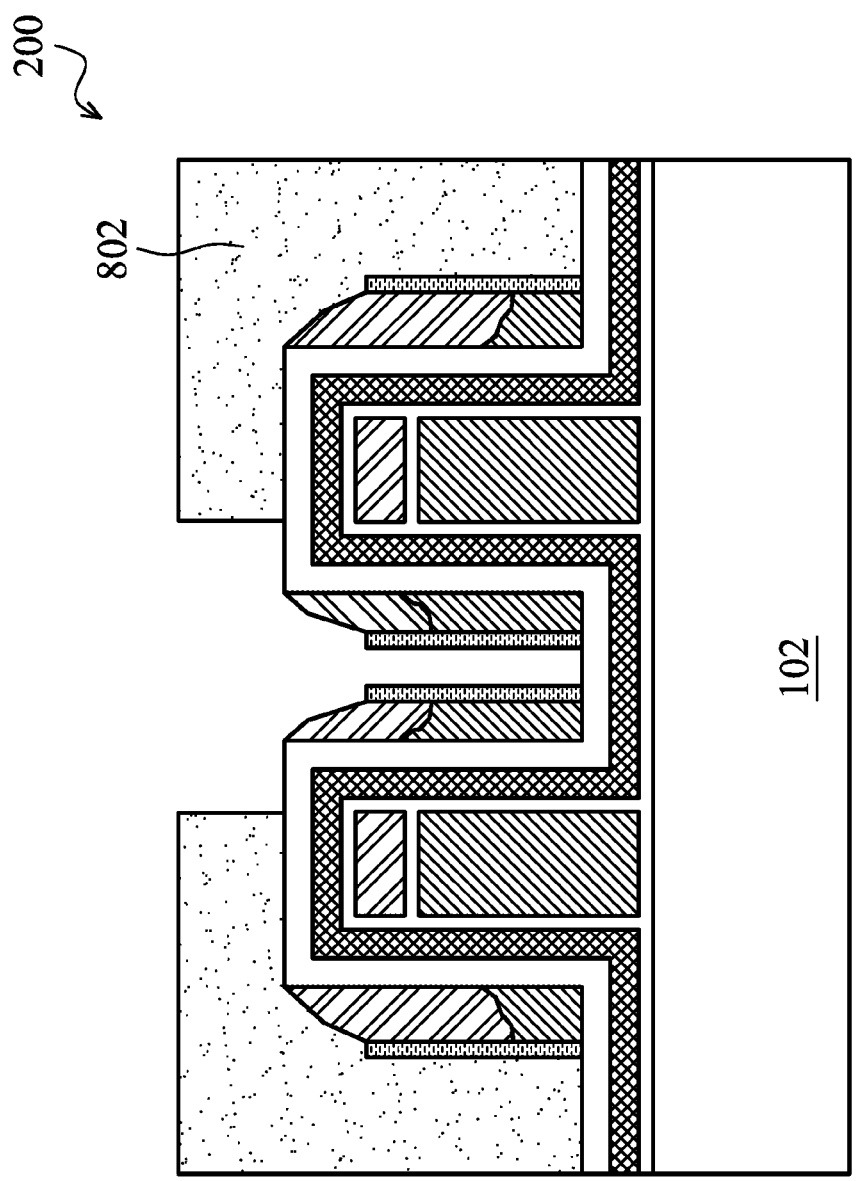
FIG. 8 illustrates a cross sectional view of the semiconductor device shown in FIG. 7 after a patterning process is applied to a photoresist layer in accordance with various embodiments of the present disclosure.

FIG. 8 illustrates a cross sectional view of the semiconductor device shown in FIG. 7 after a patterning process is applied to a photoresist layer in accordance with various embodiments of the present disclosure. The opening of a drain/source region of the semiconductor device 200 may be formed by using photolithography techniques to deposit and pattern a photoresist layer 802. A portion of the photoresist layer 802 is exposed according to the location and shape of the drain/source region. The removal of a portion of the photoresist layer 802 involves lithography operations, which are well known, and hence are not discussed in further detail herein.

Figure 9A:
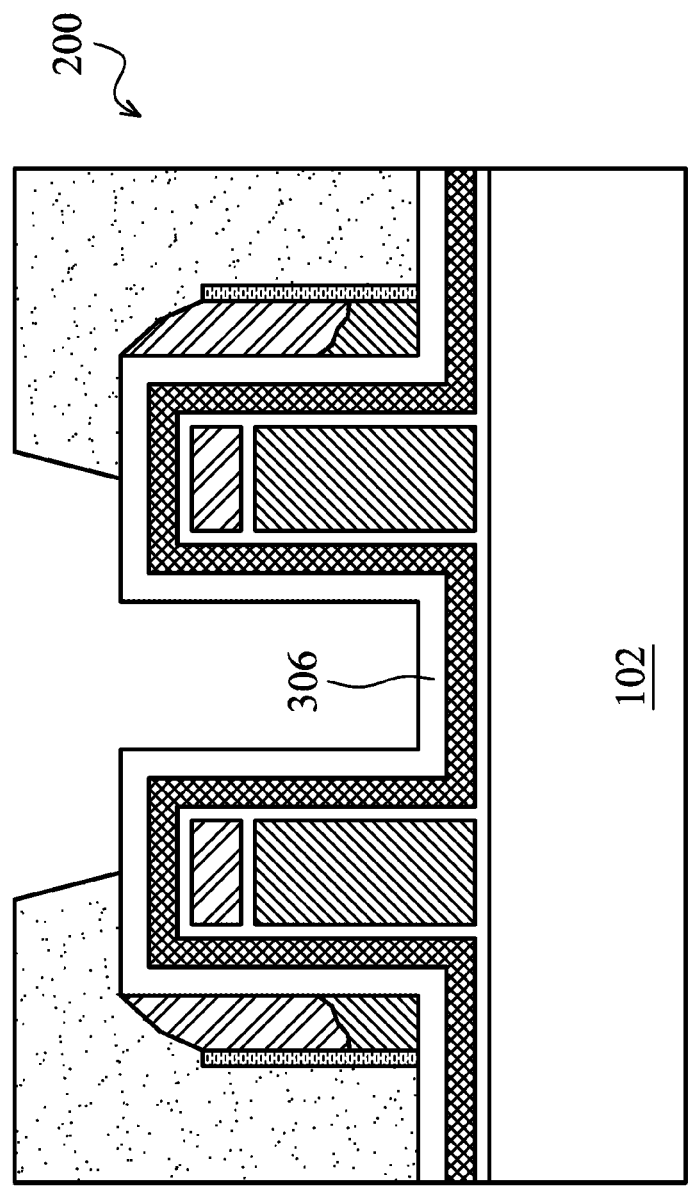
FIG. 9A illustrates a cross sectional view of the semiconductor device shown in FIG. 8 after an etching process is applied to the semiconductor device in accordance with various embodiments of the present disclosure.

FIG. 9A illustrates a cross sectional view of the semiconductor device shown in FIG. 8 after an etching process is applied to the semiconductor device in accordance with various embodiments of the present disclosure. A suitable etching process such as an isotropic dry-etch process (a.k.a. CDE) may be applied to the exposed drain/source region of the semiconductor device 200. By controlling the strength and direction of the etching process, the second memory gate structure 604 and the third memory gate structure 606 (now shown but illustrated in FIG. 7 respectively) have been removed. The etching process stops on the top surface of the second oxide layer 306.

Figure 9B:
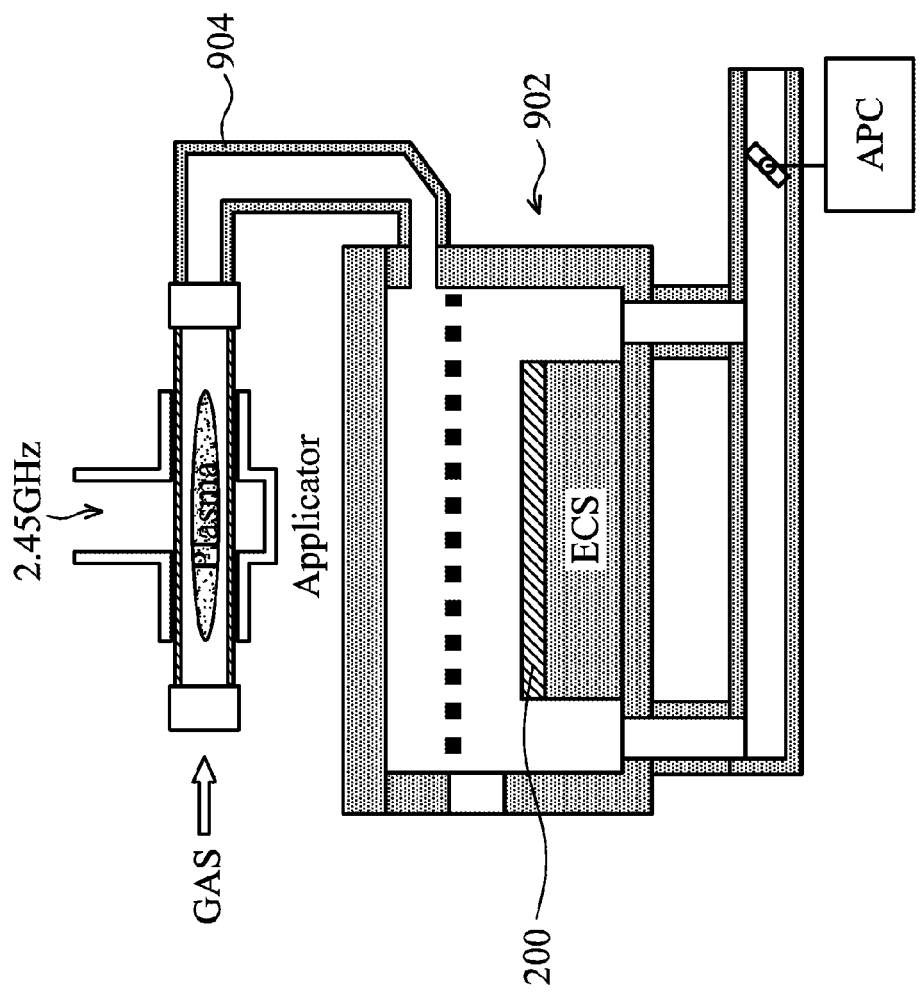
FIG. 9B illustrates a simplified diagram of the chamber of the isotropic dry etch process in accordance with various embodiments of the present disclosure.

FIG. 9B illustrates a simplified diagram of the chamber of the isotropic dry-etch process in accordance with various embodiments of the present disclosure. The semiconductor device 200 may be placed on an electrostatic chuck (ESC) inside the chamber 902. In order to prevent the plasma source of the etching process from damaging the semiconductor device 200, the plasma source is placed outside the chamber 902 as shown in FIG. 9B. The reactive gas of the dry etching process is fed into the chamber 902 through a tube 904.

In some embodiments, the active species of the dry etching process are generated in a location away from the chamber 902 and transported into the chamber 902 through the tube 904. The etching process is implemented as a down-flow etching process. Such a down-flow etching process helps to improve the uniformity of the surface of the semiconductor device 200. The ESC shown in FIG. 9B is capable of adjusting the temperature of the semiconductor device 200 so that the semiconductor device 200 is of a stable temperature during the etching process. Moreover, an automatic pressure controller (APC) is employed to maintain a stable pressure level in the chamber 902.

The reactive gases of the dry etching process include a mixture of a first gas and a second gas. The first gas may be any $C_xH_yF_z$ type etching gases such as $CF_4$, $CH_2F_2$, $CHF_3$, any combination thereof and/or the like. The second gas may be oxygen. In some embodiments, the ratio of the first gas to the second gas is in a range from about 0.5 to about 1.5. The etching process pressure is in a range from about 200 mT to about 800 mT. The etching process power is in a range from about 200 W to about 800 W.

The flow rate of the reactive gases is in a range from about 300 Standard Cubic Centimeters per Minute (SCCM) to about 800 SCCM. The etching selectivity of silicon/oxide is maintained in a range from about 5 to about 10. Likewise, the etching selectivity of nitride/oxide is maintained in a range from about 5 to about 10.

Figure 10:
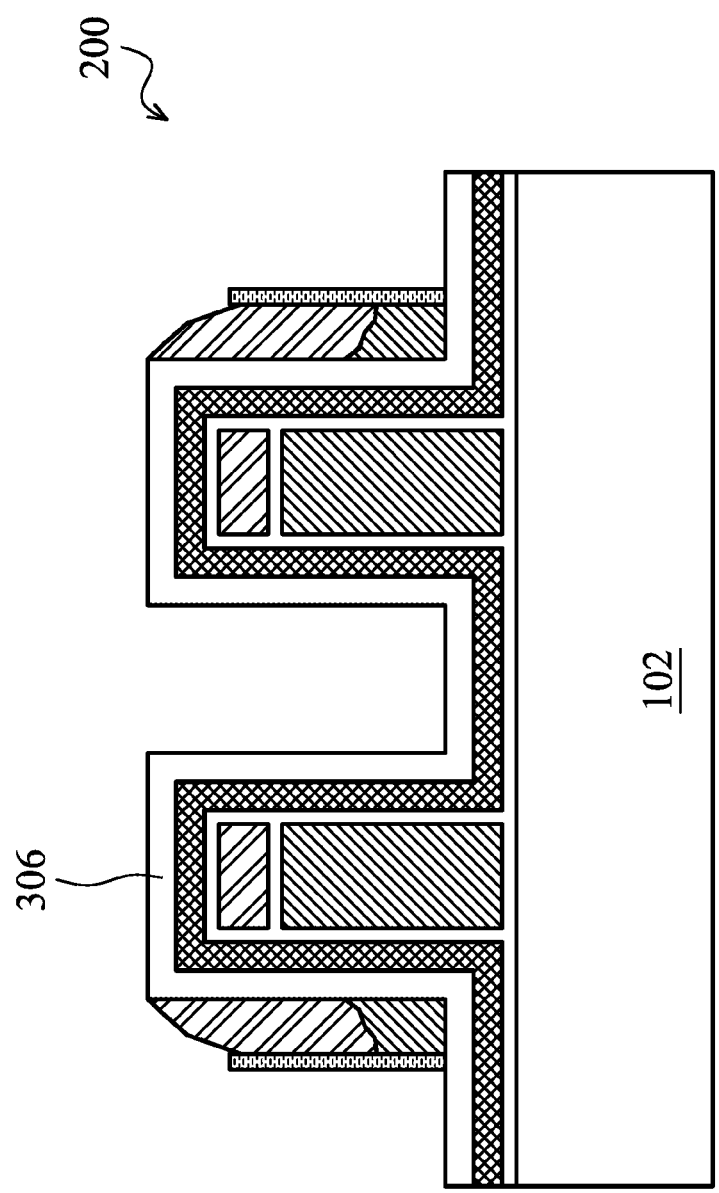
FIG. 10 illustrates a cross sectional view of the semiconductor device shown in FIG. 9A after a photoresist removal process is applied to the remaining photoresist layer in accordance with various embodiments of the present disclosure.

FIG. 10 illustrates a cross sectional view of the semiconductor device shown in FIG. 9A after a photoresist removal process is applied to the remaining photoresist layer in accordance with various embodiments of the present disclosure. The remaining photoresist layer shown in FIG. 9A may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 11:
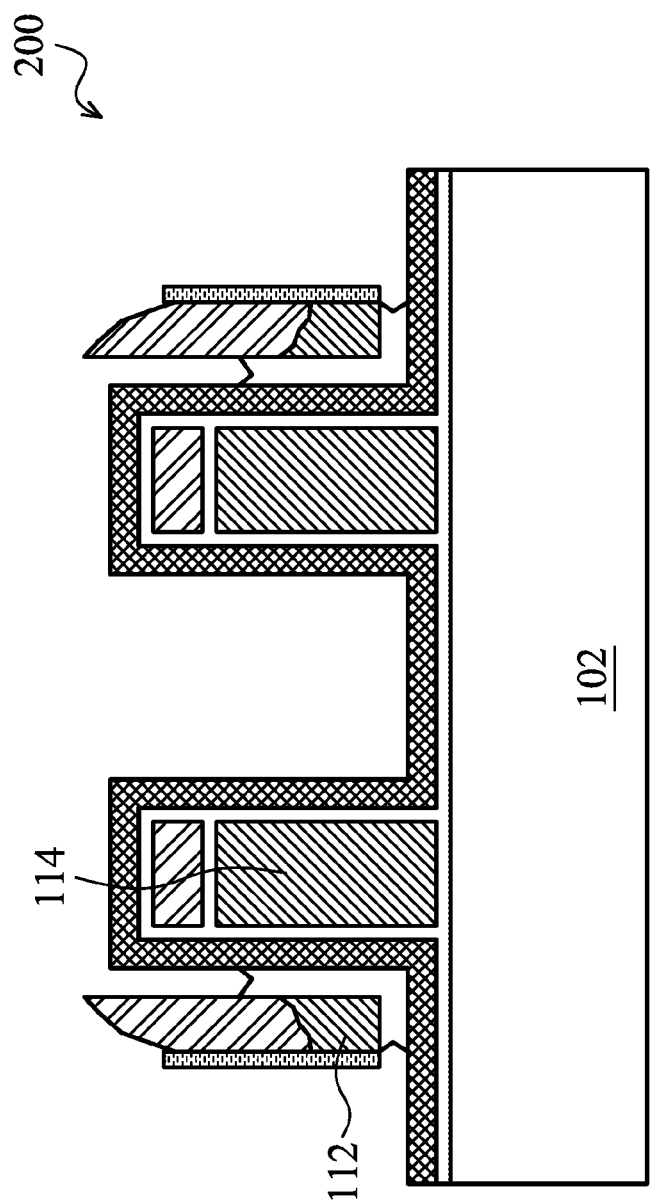
FIG. 11 illustrates a cross sectional view of the semiconductor device shown in FIG. 10 after an etching process is applied to the second oxide layer in accordance with various embodiments of the present disclosure.

FIG. 11 illustrates a cross sectional view of the semiconductor device shown in FIG. 10 after an etching process is applied to the second oxide layer in accordance with various embodiments of the present disclosure. An etching process such as a wet etching process is applied to the second oxide layer 306 (not shown but illustrated in FIG. 10). As shown in FIG. 11, a majority of the second oxide layer has been removed as a result. The remaining portion of the second oxide layer includes two L-shaped structures situated between the memory gates (e.g., memory gate 112) and their respective control gates (e.g., control gate 114).

Figure 12:
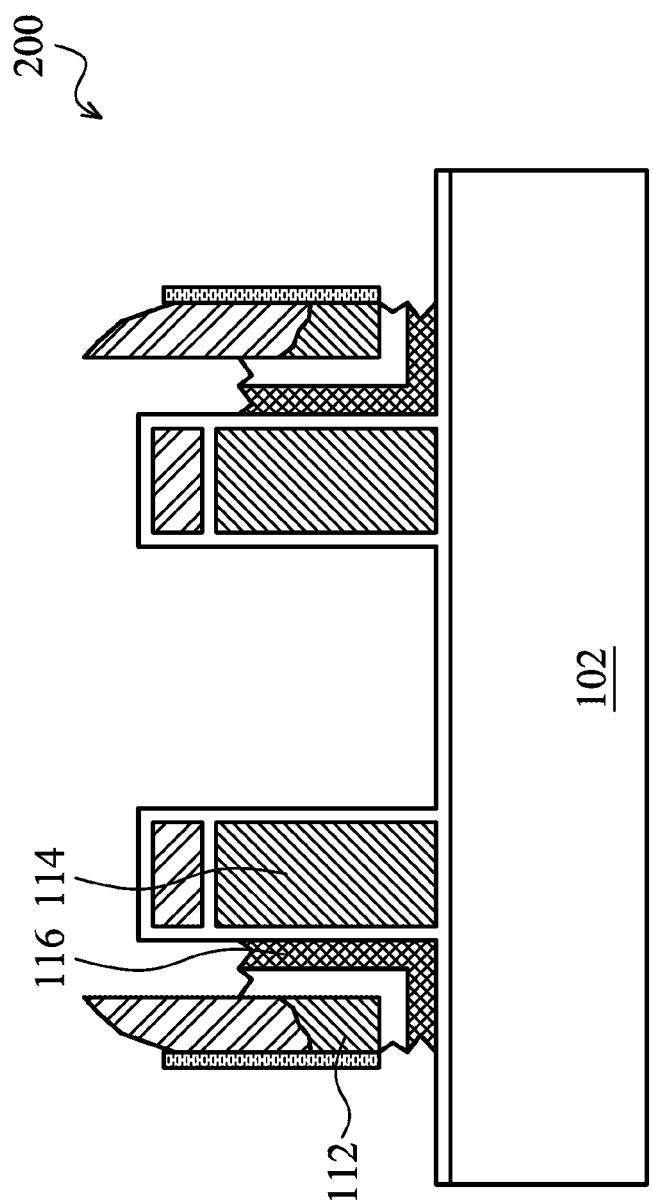
FIG. 12 illustrates a cross sectional view of the semiconductor device shown in FIG. 11 after an etching process is applied to the semiconductor device in accordance with various embodiments of the present disclosure.

FIG. 12 illustrates a cross sectional view of the semiconductor device shown in FIG. 11 after an etching process is applied to the semiconductor device in accordance with various embodiments of the present disclosure. A suitable etching process such as an isotropic dry etch process is applied to the exposed portions of the silicon dot layer 304. As a result, a majority of the silicon dot layer 304 has been removed. The isotropic dry etch process has been described above with respect to FIG. 9A and FIG. 9B, and hence is not discussed again to avoid unnecessary repetition.

As shown in FIG. 12, the remaining silicon dot layer 304 may include two L-shaped layers. The L-shaped layers such as layer 116 may function as a charge storage layer for the semiconductor device 200.

Figure 13:
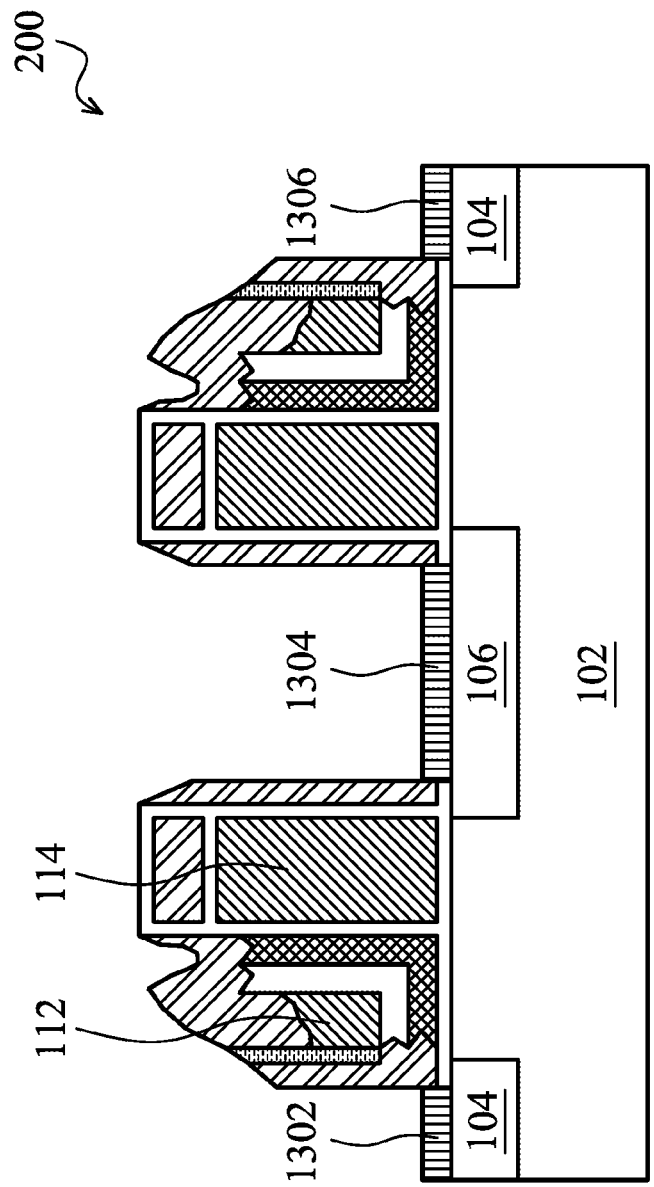
FIG. 13 illustrates a cross section view of the semiconductor device shown in FIG. 12 after a spacer deposition and an ion implantation process are applied to the semiconductor device in accordance with various embodiments of the present disclosure.

FIG. 13 illustrates a cross section view of the semiconductor device shown in FIG. 12 after a spacer deposition and an ion implantation process are applied to the semiconductor device in accordance with various embodiments of the present disclosure. A spacer layer (not shown) may be formed by blanket depositing one or more spacer layers (not shown) over the semiconductor device 200. The spacer layer may comprise SiN and/or the like and may be formed by commonly used methods such as CVD, PECVD, sputter, and other methods known in the art. The spacer layer may be patterned, such as by isotropically or anisotropically etching, thereby removing the spacer layer over the drain/source regions. It should be noted that the top surface of the memory gate 112 is covered by a spacer layer as shown in FIG. 13. Such a spacer layer helps to prevent a salicide layer from being formed over the memory gate 112.

The drain/source regions 104 and 106 may be formed through an ion implantation process. As is known to those of skill in the art, the use of dopant atoms in an implant step may form the drain/source regions 104 and 106 with a particular conductivity type. Depending on different applications, the drain/source regions 104 and 106 may be n-type or p-type. In some embodiments, the drain/source regions 104 and 106 may be a p-type region. Appropriate p-type dopants such as boron, gallium, indium and/or the like are implanted into the substrate 102 to form the drain/source regions 104 and 106. Alternatively, the drain/source regions 104 and 106 may be an n-type region. Appropriate n-type dopants such as phosphorous, arsenic and/or the like are implanted into the substrate 102 to form the drain/source regions 104 and 106.

FIG. 13 further illustrates a cross sectional view of the semiconductor device shown in FIG. 12 after silicide regions are formed over the drain/source regions 104 and 106. The silicide regions 1302, 1304 and 1306 are formed by a salicide process. In a salicide process, a thin layer of metal is blanket deposited over a semiconductor wafer having exposed drain/source regions. The wafer is then subjected to one or more annealing steps. This annealing process causes the metal to selectively react with the exposed silicon of the source/drain regions, thereby forming metal silicide regions 1302, 1304 and 1306 over the drain/source regions. The process is referred to as a self-aligned silicidation process because the silicide layer is formed only where the metal material directly contacts the silicon drain/source regions and the gate electrodes.

In some embodiments, silicide regions 1302, 1304 and 1306 comprise metals that react with silicon such as titanium, platinum, cobalt and the like. However, other metals, such as manganese, palladium and the like, can also be used.

Figure 14:
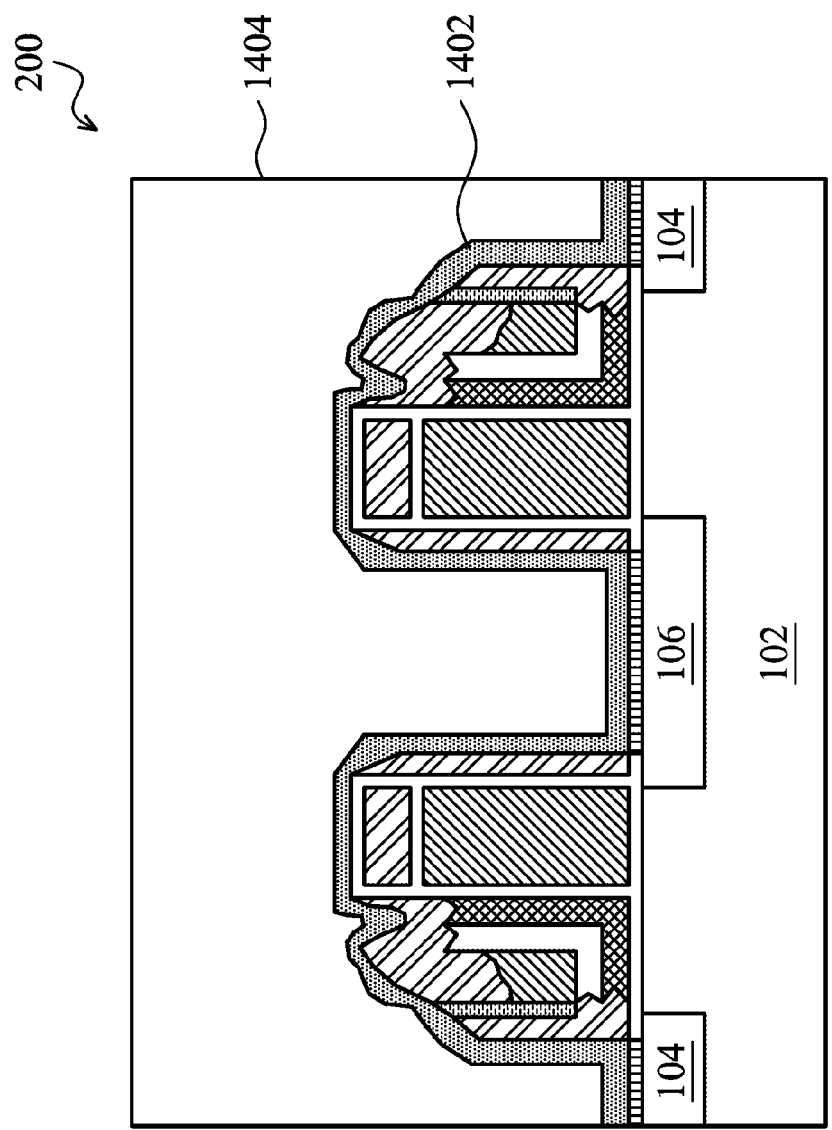
FIG. 14 illustrates a cross sectional view of the semiconductor device shown in FIG. 13 after a contact etch stop layer (CESL) is formed on the semiconductor device in accordance with various embodiments of the present disclosure.

FIG. 14 illustrates a cross sectional view of the semiconductor device shown in FIG. 13 after a contact etch stop layer (CESL) is formed on the semiconductor device in accordance with various embodiments of the present disclosure. The CESL 1402 may comprise commonly used dielectric materials, such as silicon nitride, silicon oxynitride, silicon oxycarbide, silicon carbide, combinations thereof, and multi-layers thereof. The CESL 1402 is deposited over the semiconductor device through suitable deposition techniques such as sputtering, CVD and the like.

An inter-layer dielectric (ILD) layer 1404 may be formed over the CESL 1402. The ILD layer 1404 may be formed by chemical vapor deposition, sputtering, or any other methods known and used in the art for forming an ILD, using, e.g., tetra-ethyl-ortho-silicate (TEOS) and oxygen as a precursor. The ILD layer 1404 may be about 4,000 Å to about 13,000 Å in thickness, but other thicknesses may be used. The ILD layer 1404 may comprise doped or undoped silicon oxide, although other materials such as silicon nitride doped silicate glass, high-k materials, combinations of these, or the like, may alternatively be utilized.

Figure 15:
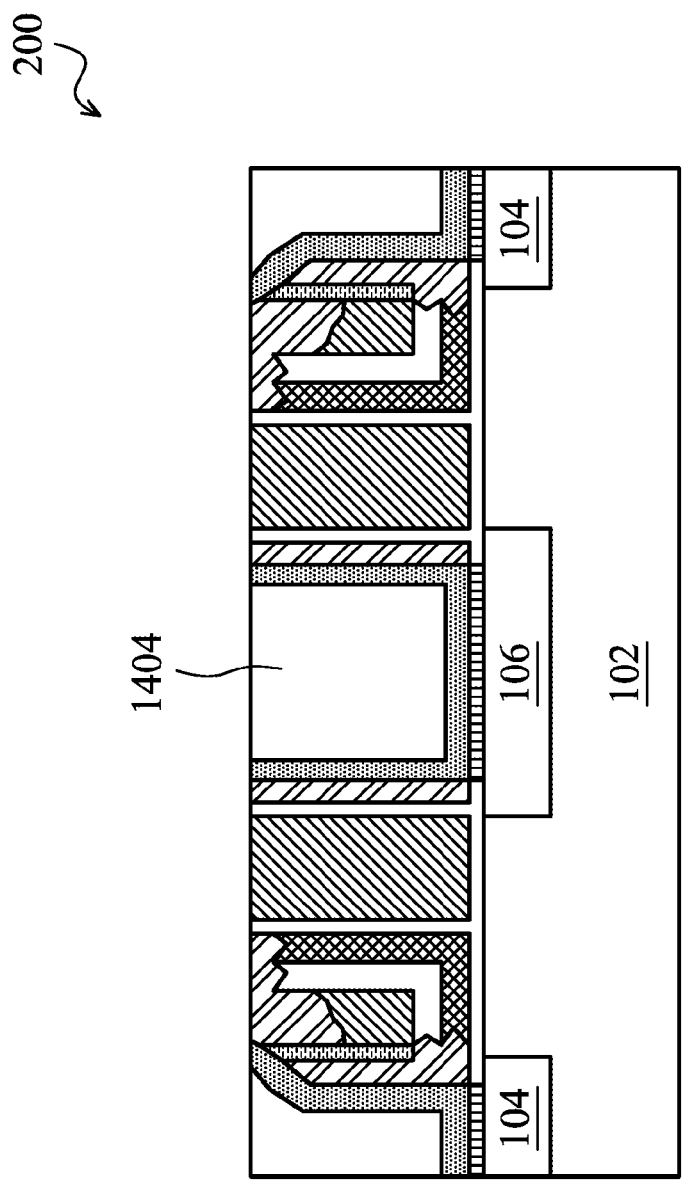
FIG. 15 illustrates a cross section view of the semiconductor device shown in FIG. 14 after a chemical mechanical polish (CMP) process is applied to the top surface of the semiconductor device in accordance with various embodiments of the present disclosure.

FIG. 15 illustrates a cross section view of the semiconductor device shown in FIG. 14 after a chemical mechanical polish (CMP) process is applied to the top surface of the semiconductor device in accordance with various embodiments of the present disclosure. A planarization process, such as CMP, etch back step and the like, may be performed to planarize the top surface of the ILD layer 1404. As shown in FIG. 15, a portion of the ILD layer 1404 has been removed as a result.

Figure 16:
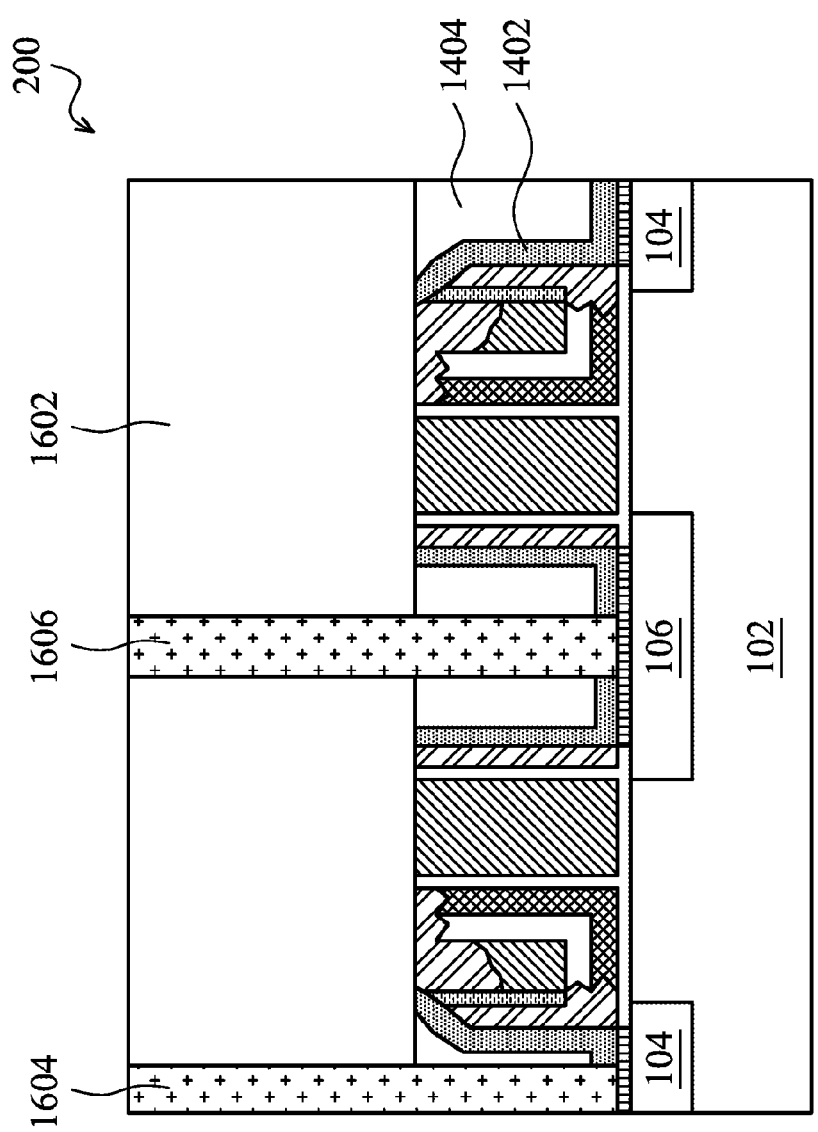
FIG. 16 illustrates a cross section view of the semiconductor device shown in FIG. 15 after a variety of contacts are formed in the semiconductor device in accordance with various embodiments of the present disclosure.

FIG. 16 illustrates a cross section view of the semiconductor device shown in FIG. 15 after a variety of contacts are formed in the semiconductor device in accordance with various embodiments of the present disclosure. A dielectric layer 1602 may be formed over the ILD layer 1404. A plurality of openings (not shown) may be formed by etching the dielectric layer 1602 as well as the ILD layer 1404. With the help of the CESL layer 1402, the etching process of the dielectric layer 1602 and the ILD layer 1404 is more precisely controlled. The CESL layer 1402, the ILD layer 1404 and the dielectric layer 1602 in the openings are also removed, thereby exposing the underlying silicide regions over the drain/source regions 104 and 106.

A metallic material, which includes tungsten, titanium, aluminum, copper, any combinations thereof and/or the like, is filled into the openings, forming contact plugs 1604 and 1606.

Figure 17:
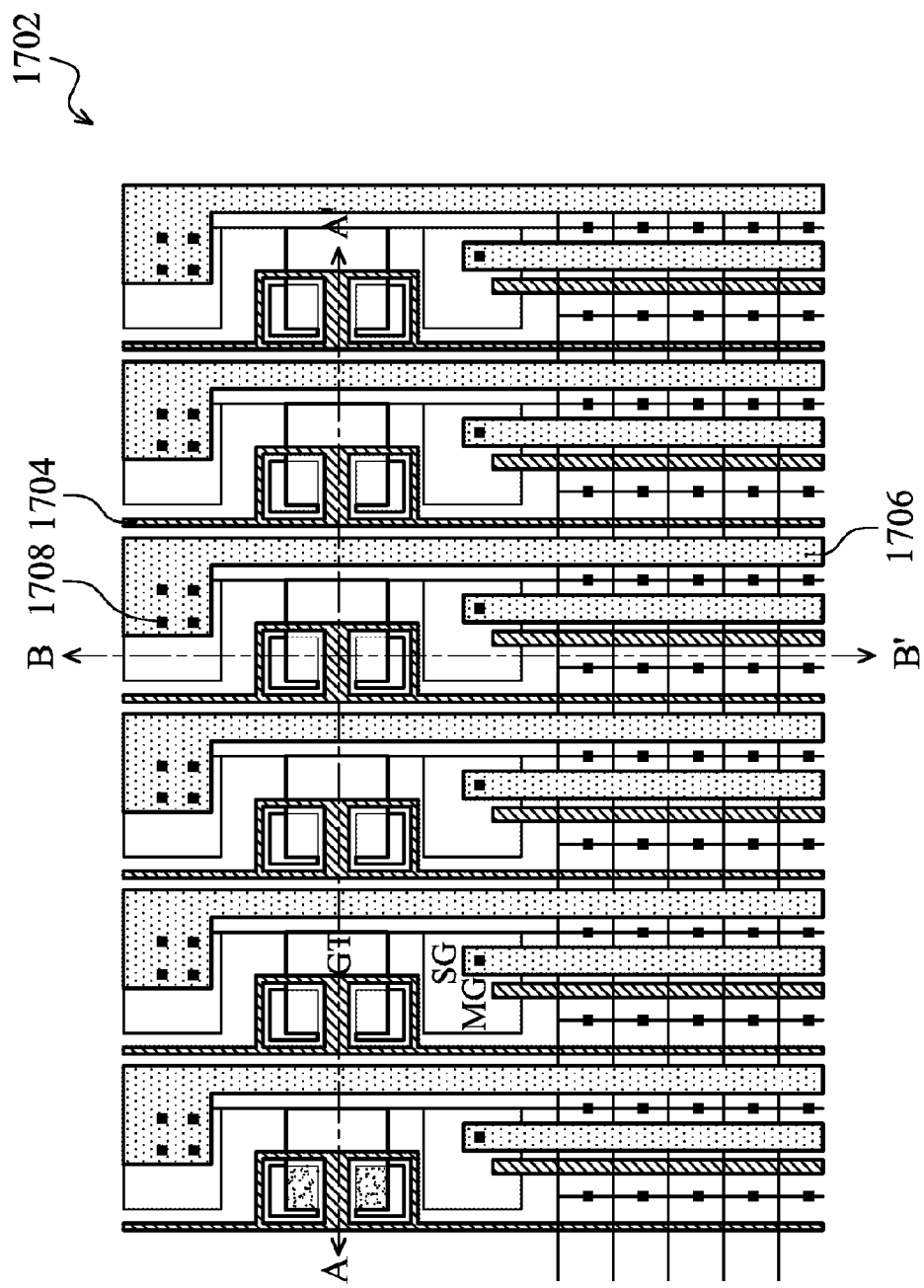
FIG. 17 illustrates a top view of a memory structure in accordance with various embodiments of the present disclosure.

FIG. 17 illustrates a top view of a memory structure in accordance with various embodiments of the present disclosure. The memory structure 1702 includes a plurality of memory cells arranged in rows and columns. As shown in FIG. 17, a memory gate structure 1704 and the control gate structure 1706 are placed in parallel. The control gate structure 1706 has its own contacts 1708 as shown in FIG. 17. The formation of the contacts of the memory gate structure includes forming an opening adjacent to the memory gate structure 1704, filling a conductive material or a variety of conductive materials into the opening to form a conductive region (not shown but illustrated in FIG. 18), wherein the conductive region is electrically coupled to the memory gate structure 1704 and forming a plurality of contact plugs over the conductive region.

Figure 18:
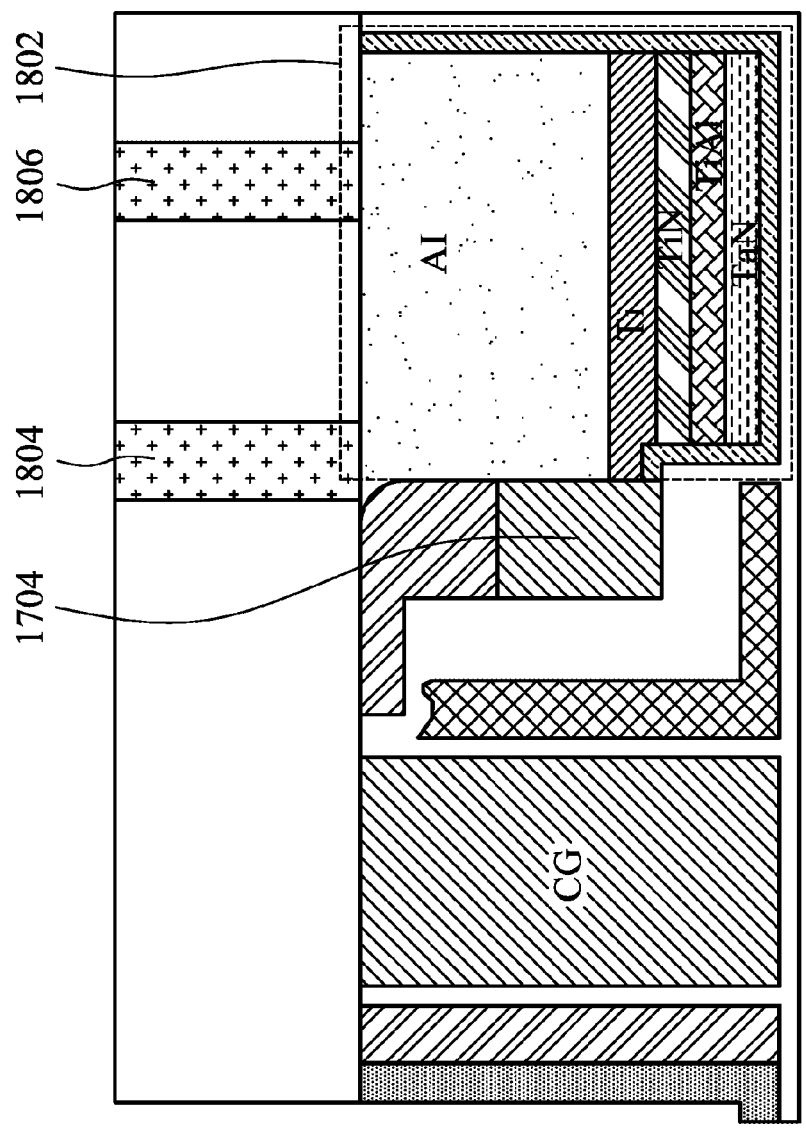
FIG. 18 illustrates a cross sectional view of the conductive region of the memory structure in accordance with various embodiments of the present disclosure.

FIG. 18 illustrates a cross sectional view of the conductive region of the memory structure in accordance with various embodiments of the present disclosure. The cross sectional view shown in FIG. 18 is taken along line A-A' of FIG. 17. As shown in FIG. 18, the conductive region 1802 is formed adjacent to the memory gate structure 1704 and electrically coupled to the memory gate structure 1704. Two contact plugs 1804 and 1806 are formed over the conductive region 1802 as shown in FIG. 18.

The conductive region 1802 may include a plurality of conductive layers stacked together. As shown in FIG. 18, the stacked conductive layers may be formed of TaN, TiAl, TiN, Ti, Al respectively.

Figure 19:
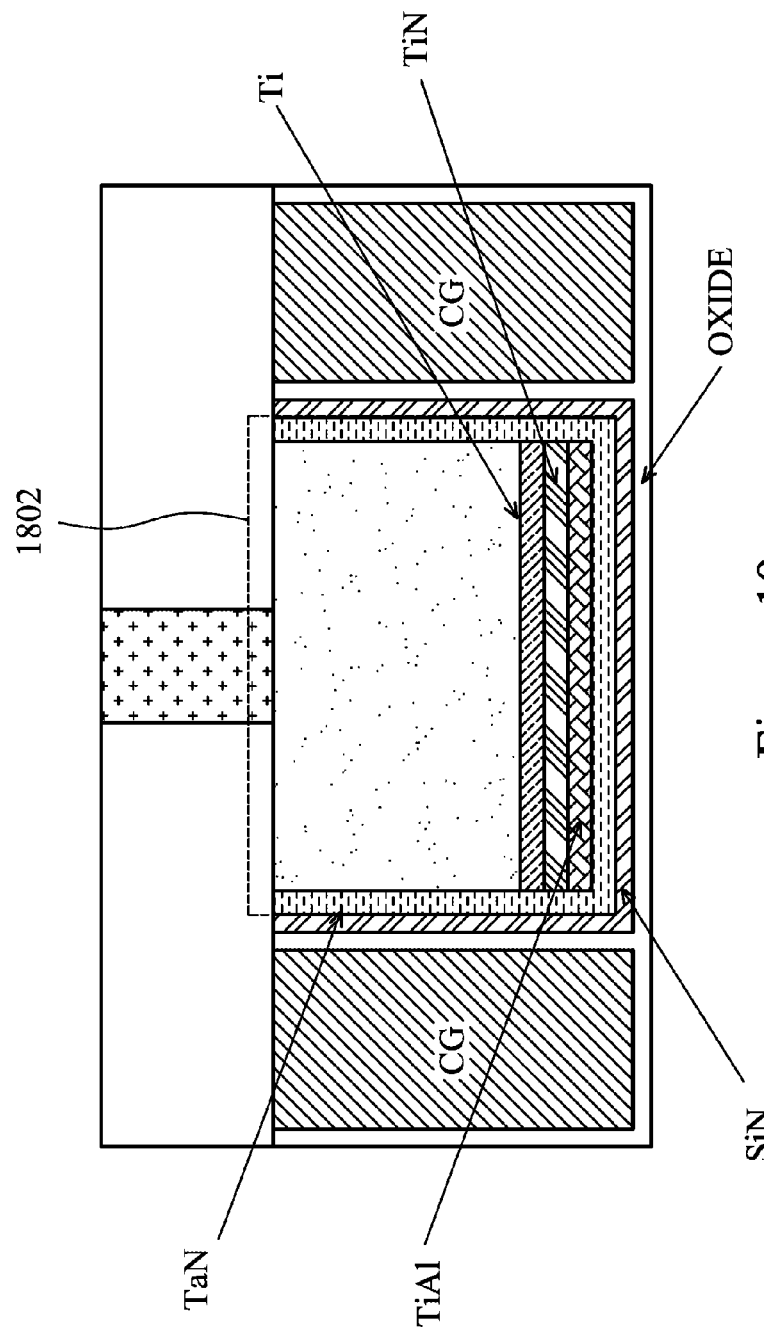
FIG. 19 illustrates another cross sectional view of the conductive region of the memory structure in accordance with various embodiments of the present disclosure.

FIG. 19 illustrates another cross sectional view of the conductive region of the memory structure in accordance with various embodiments of the present disclosure. The cross sectional view shown in FIG. 19 is taken along line B-B' of FIG. 17. As shown in FIG. 19, the conductive region 1802 may include a plurality of conductive layers stacked together. As shown in FIG. 19, the stacked conductive layers may be formed of TaN, TiAl, TiN, Ti, Al respectively. FIG. 19 further illustrates the conductive region 1802 is formed between two control gate structures.

In accordance with an embodiment, a method comprises forming a control gate structure over a substrate, depositing a charge storage layer over the control gate structure, depositing a memory gate layer over the charge storage layer, depositing a first dielectric layer over the memory gate layer, applying a first etching process to the first dielectric layer and the memory gate layer to form a first memory gate structure and a second memory gate structure, wherein the first memory gate structure and the second memory gate structure are formed along opposite sidewalls of the control gate structure, forming first spacers along sidewalls of the first memory gate structure and the second memory gate structure.

The method further comprises removing the second memory gate structure, applying a second etching process to the charge storage layer form an L-shaped charge storage layer, wherein the L-shaped charge storage layer is located between the first memory gate structure and the control gate structure, forming a second spacer over the memory gate structure and forming a first drain/source region adjacent to the memory gate structure and a second drain/source region adjacent to the control gate structure.

In accordance with an embodiment, a method comprises forming a control gate structure over a substrate, forming an Oxide-Silicon-Oxide layer over the control gate structure, depositing a memory gate layer over the Oxide-Silicon-Oxide layer, depositing a memory gate mask layer over the memory gate layer, forming a first memory gate structure and a second memory gate structure through a first etching process, wherein the first memory gate structure and the second memory gate structure are formed along opposite sidewalls of the control gate structure, forming first spacers along sidewalls of the first memory gate structure and the second memory gate structure.

The method further comprises removing the second memory gate structure through a second etching process, applying a third etching process to a top oxide layer of the Oxide-Silicon-Oxide layer, applying a fourth etching process to a silicon dot layer of the Oxide-Silicon-Oxide layer, forming a second spacer over the memory gate structure and forming a first drain/source region adjacent to the memory gate structure and a second drain/source region adjacent to the control gate structure.

In accordance with an embodiment, an apparatus comprises a control gate structure over a substrate, a memory gate structure over the substrate, wherein a charge storage layer formed between the control gate structure and the memory gate structure, a first spacer along a sidewall of the memory gate structure, a second spacer over a top surface of the memory gate structure, a first drain/source region formed in the substrate and adjacent to the memory gate structure and a second drain/source region formed in the substrate and adjacent to the control gate structure.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
 a control gate structure over a substrate;
 a memory gate structure over the substrate, wherein a charge storage layer formed between the control gate structure and the memory gate structure and an oxide layer formed between the charge storage layer and the memory gate structure;
 a first spacer along a sidewall of the memory gate structure, wherein an innermost edge of a bottom of the first spacer is in contact with an outermost edge of the oxide layer;
 a second spacer over a top surface of the memory gate structure;
 a first drain/source region formed in the substrate and adjacent to the memory gate structure; and
 a second drain/source region formed in the substrate and adjacent to the control gate structure.

2. The apparatus of claim 1, wherein:
 the charge storage layer is an L-shaped layer.

3. The apparatus of claim 2, wherein:
 a horizontal side of the L-shaped layer is formed between the memory gate structure and the substrate; and
 a vertical side of the L-shaped layer is formed between the memory gate structure and the control gate structure.

4. The apparatus of claim 1, wherein:
 the charge storage layer is a silicon dot layer.

5. The apparatus of claim 1, wherein:
the first spacer is formed of silicon nitride; and
the second spacer is formed of silicon nitride.

6. A device comprising:
a control gate structure over a substrate;
an L-shaped charge storage layer having a vertical side extending along a sidewall of the control gate structure;
a memory gate structure over the substrate;
an L-shaped dielectric layer between the memory gate structure and the L-shaped charge storage layer;
a thin spacer layer extending along a sidewall of the memory gate structure, wherein a thickness of the L-shaped dielectric layer is greater than a thickness of the thin spacer layer, and wherein the thin spacer layer and a vertical portion of the L-shaped dielectric layer are on opposite sides of the memory gate structure; and
a spacer layer over a top surface of the memory gate structure.

7. The device of claim 6, wherein:
the L-shaped dielectric layer extends along the L-shaped charge storage layer.

8. The device of claim 6, wherein:
the L-shaped charge storage layer is a silicon dot layer.

9. The device of claim 6, further comprising:
a first drain/source region formed in the substrate and adjacent to the memory gate structure; and
a second drain/source region formed in the substrate and adjacent to the control gate structure.

10. The device of claim 6, wherein:
the control gate structure and the substrate are separated by a control gate dielectric layer.

11. The device of claim 6, wherein:
the thin spacer layer is a silicon nitride layer.

12. The device of claim 6, wherein:
the spacer layer is a silicon nitride layer.

13. The device of claim 6, wherein:
a lower portion of the thin spacer layer is in direct contact with the sidewall of the memory gate structure.

14. The device of claim 6, wherein:
an upper portion of the thin spacer layer is in direct contact with a sidewall of the spacer layer.

15. An apparatus comprising:
a control gate electrode layer over a substrate;
an L-shaped charge storage layer having a vertical portion extending along a sidewall of the control gate electrode layer and a horizontal portion extending along a top surface of the substrate;
an L-shaped oxide layer extending along the L-shaped charge storage layer;
a memory gate electrode layer between a thin spacer layer and a vertical portion of the L-shaped oxide layer, wherein an innermost edge of a bottom of the thin spacer layer is in contact with a top corner of a horizontal portion of the L-shaped oxide layer; and
a spacer layer over a top surface of the memory gate electrode layer.

16. The apparatus of claim 15, further comprising:
a control gate dielectric layer, wherein the control gate electrode layer and the substrate are separated by the control gate dielectric layer.

17. The apparatus of claim 15, wherein:
the memory gate electrode layer has a first sidewall in direct contact with the vertical portion of the L-shaped oxide layer and a second sidewall in direct contact with the thin spacer layer.

18. The apparatus of claim 15, wherein:
the memory gate electrode layer has a bottom in direct contact with the horizontal portion of the L-shaped oxide layer and a top in direct contact with the spacer layer.

19. The apparatus of claim 15, wherein:
the thin spacer layer and the spacer layer are formed of silicon nitride.

* * * * *